United States Patent [19]
Nguyen et al.

[11] Patent Number: 5,856,217
[45] Date of Patent: Jan. 5, 1999

[54] MODULATION-DOPED FIELD-EFFECT TRANSISTORS AND FABRICATION PROCESSES

[75] Inventors: Chanh N. Nguyen, Newbury Park; Nguyen Xuan Nguyen, Oxnard; Minh V. Le, Simi Valley, all of Calif.

[73] Assignee: Hughes Electronics Corporation, El Segundo, Calif.

[21] Appl. No.: 835,674

[22] Filed: Apr. 10, 1997

[51] Int. Cl.$^6$ ................................................. H01L 21/283
[52] U.S. Cl. ........................... 438/172; 438/192; 438/169
[58] Field of Search .................................. 438/172, 179, 438/169; 257/192

[56] References Cited

U.S. PATENT DOCUMENTS

| | | | |
|---|---|---|---|
| 4,662,060 | 5/1987 | Aina et al. | 438/185 |
| 5,192,987 | 3/1993 | Khan et al. | 257/183.1 |
| 5,358,878 | 10/1994 | Suchet et al. | 438/172 |
| 5,563,422 | 10/1996 | Nakamura et al. | 257/13 |
| 5,641,711 | 6/1997 | Cho | 427/255.5 |
| 5,677,553 | 10/1997 | Yamamoto et al. | 257/192 |
| 5,698,870 | 12/1997 | Nakano et al. | 257/194 |

OTHER PUBLICATIONS

S. Wolf and R.N. Tauber, "Silicon Processing for the VLSI Era vol. 1–Process Technology." Lattice Press, Sunset Beach CA. p. 546, 1986.

Williams, Ralph, *Modern GaAs Processing Methods,* Artech House, Norwood, MA, 1990, pp. 140–146 and 199–205.

*Primary Examiner*—Charles Bowers
*Assistant Examiner*—Craig Thompson
*Attorney, Agent, or Firm*—V. D. Duraiswamy; W. K. Denson-Low

[57] ABSTRACT

A process is provided for fabricating MODFET's in group III nitride compound semiconductors. The process precedes isolation of the MODFET structure with the use of e-beam lithography to define very narrow (e.g., ~0.25 micrometer) gates which enhance transistor microwave cut-off frequency. Because these compound semiconductors resist chemical etchants, isolation is accomplished by etching with reactive ions to form an isolation mesa having a vertical mesa sidewall. To improve breakdown, the mesa sidewall is covered with a passivation layer prior to deposition of a gate feed that contacts the gate. To reduce parasitic gate capacitance, the gate feed is spaced from a narrow edge of the transistor's two-dimensional electron gas.

11 Claims, 3 Drawing Sheets

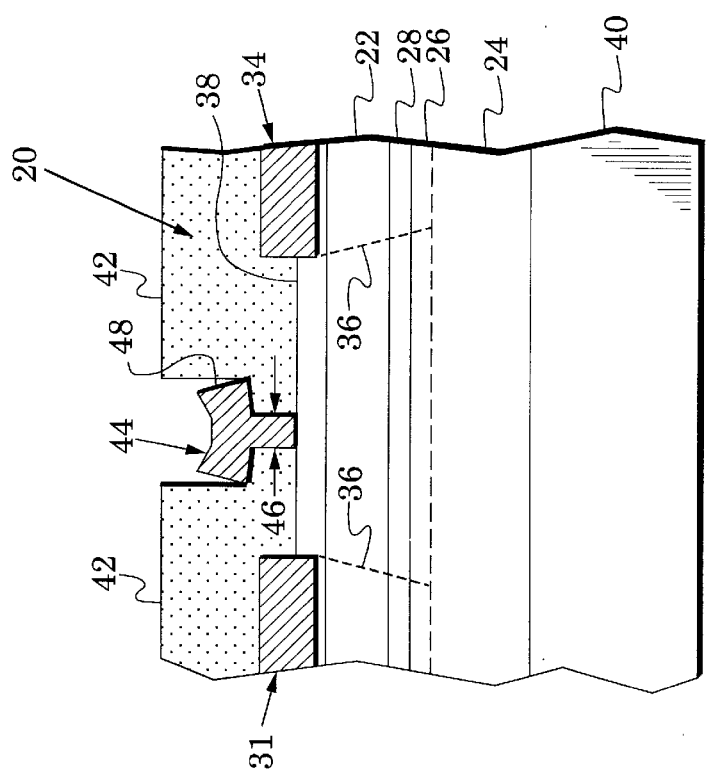
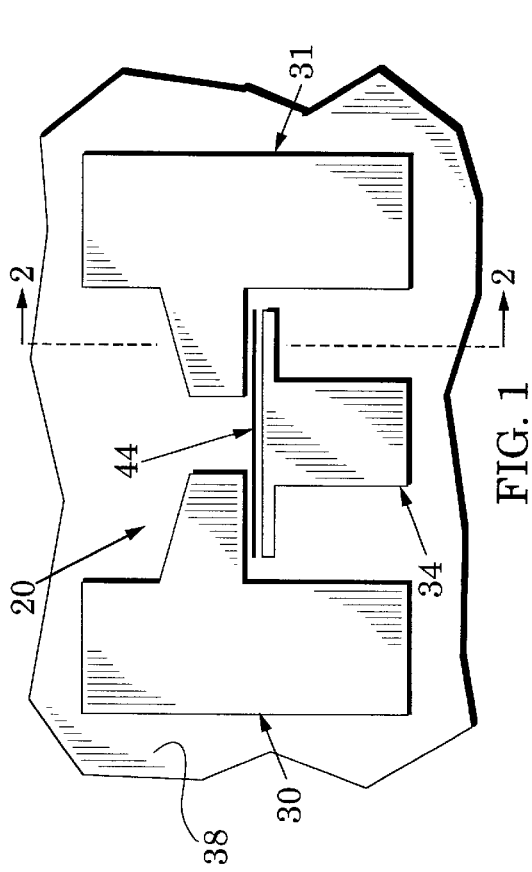
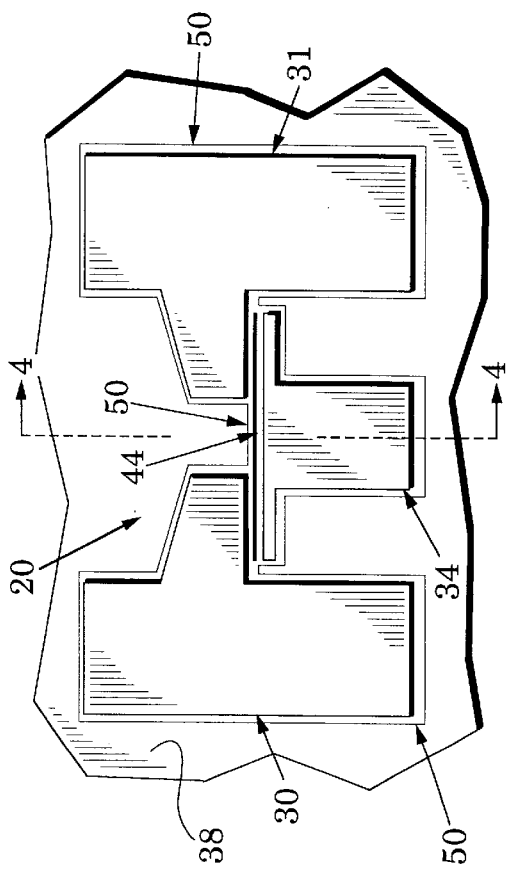

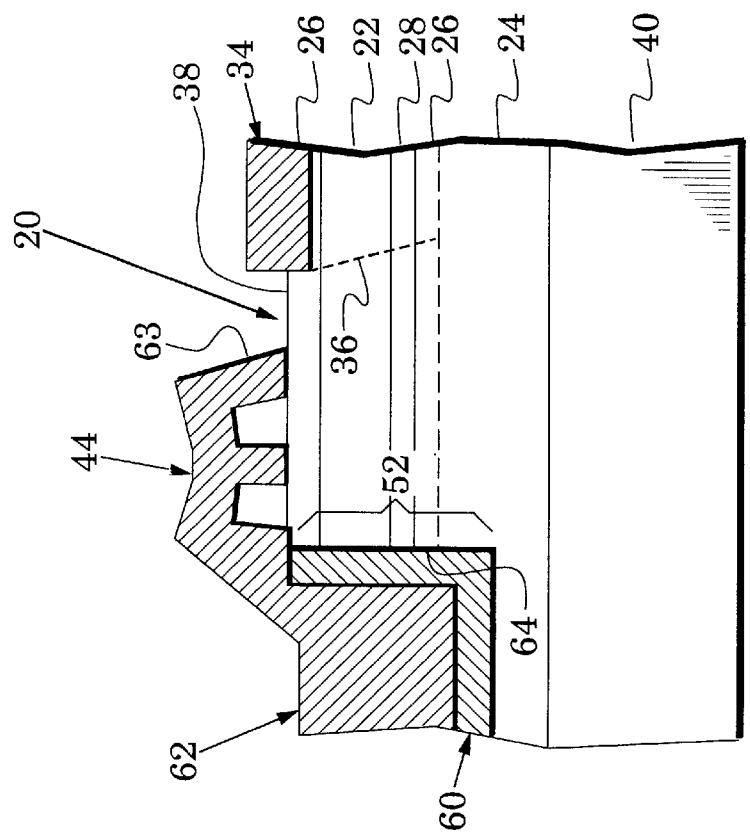
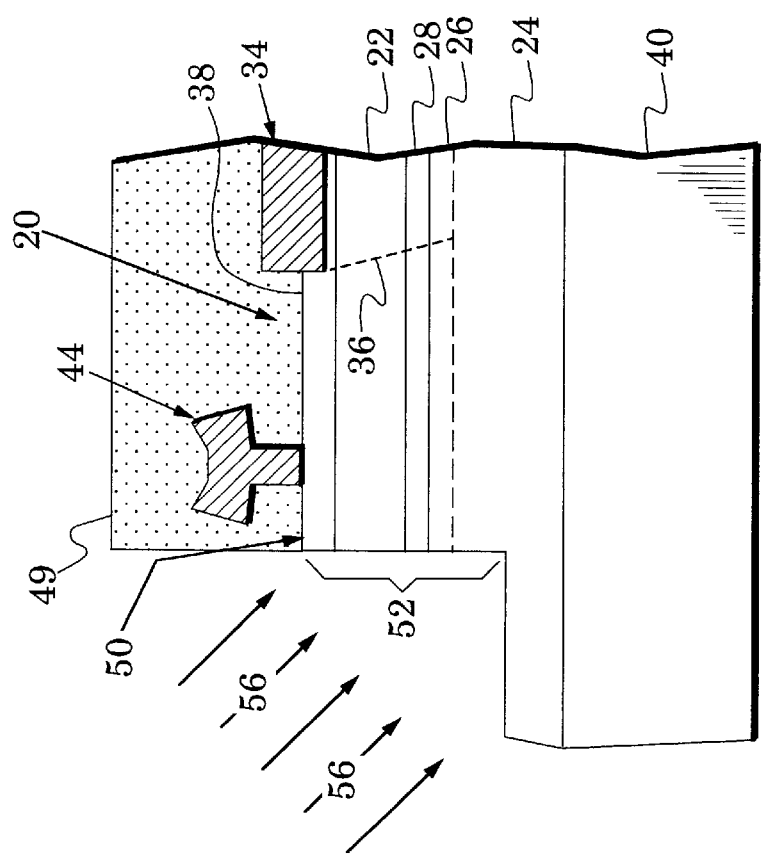

MODULATION-DOPED FIELD-EFFECT TRANSISTORS AND FABRICATION PROCESSES

This invention was made with Government under contract No. N66001-96-C-8637 awarded by the Department of the Navy. The Government has certain rights in this invention.

BACKGROUND OF THE INVENTION

1. Field of the Invention

The present invention relates generally to modulation-doped field-effect transistors and, more particularly, to fabrication processes for these transistors.

2. Description of the Related Art

Group III nitride compound semiconductors (e.g., gallium nitride, aluminum nitride, indium nitride and their alloys) have recently emerged as promising materials for high-power and high-temperature microwave performance. These nitride semiconductors have a higher chemical stability than previous semiconductors. In addition, they exhibit large bandgaps, high breakdown fields and high electron peak and saturated velocities. Accordingly, they have become the primary candidates for realizing high-power, high-temperature microwave amplifying devices (e.g., modulation-doped field-effect transistors (MODFET's)) in a variety of electronic fields (e.g., active array radars and wireless satellite communications).

However, some of the parameters of the group III nitride compound semiconductors which make their microwave performance attractive also present fabrication difficulties. For example, there does not exist at this time any wet chemical etchant that can controllably etch these compound semiconductors. In addition, the wide bandgap of these compound semiconductors causes them to be particularly susceptible to "charging" during electron-beam (e-beam) writing steps. Both e-beam lithography and optical photolithography techniques are widely used for defining and fabricating transistor details. However, the ability of optical photolithography to resolve transistor structures is limited, (e.g., to the region of one micrometer). Thus, optical photolithography techniques cannot generally produce the small gate lengths (e.g., on the order of 0.25 micrometer) which are desirable for microwave transistors.

Accordingly, e-beam lithography is typically used to define transistor structures of smaller size (e.g., gate lengths in the region of 0.25 micrometers). In contrast with optical photolithography, masks are not typically used in e-beam lithography to expose resist materials. Instead, a focused electron beam is rastered ("written") over the resist to expose it.

Although e-beams can write exceedingly small resist patterns, the accuracy of this process is degraded if the e-beam is deflected by spurious electric charges. This deflection is typically referred to as "charging" (e.g., see Williams, Ralph, *Modern GaAs Processing Methods,* Artech House, Norwood, Mass., 1990, pp. 140–146). It is accentuated by the presence of the high-resistivity substrates (e.g., sapphire and silicon carbide) which are preferably used with the group III nitride compound semiconductors. Charging is especially troublesome if the transistor has been isolated from surrounding structures because this fabrication step removes current paths which would otherwise be available for current discharge (e.g., see Williams, pp. 199–205).

In response to these fabrication problems, gates of group III nitride compound semiconductors have been typically fabricated with the use of optical photolithography. In addition, the lack of a chemical etchant has prevented selective etching to undercut gate leads and, thereby, reduce gate capacitance which degrades microwave cut-off frequencies. As a result, the microwave performance of transistors formed with group III nitride compound semiconductors has not realized the potential of these materials.

SUMMARY OF THE INVENTION

The present invention is directed to processes which facilitate the fabrication of group III nitride compound semiconductors and to high-performance microwave semiconductor structures (e.g., MODFET's) made with these processes.

These goals are realized with a fabrication process that initially provides a layered semiconductor structure with:

a) a first semiconductor layer which has a first band gap and is doped with a charge carrier;

b) a second semiconductor layer which has a second band gap that is less than the first band gap and is positioned below the first semiconductor layer to generate a two-dimensional electron gas;

c) a substrate which supports the first and second semiconductor layers; and d) source and drain ohmic contacts which communicate with the two-dimensional electron gas.

The fabrication process then writes a gate pattern between the source and drain ohmic contacts with e-beam lithography and deposits a metallic gate in the gate pattern. Subsequently, the gate, the source and drain ohmic contacts, the first semiconductor layer and the two-dimensional gas are isolated on a mesa which has a mesa sidewall. Finally, a passivation layer is positioned over the mesa sidewall and a metallic gate feed is deposited to pass over the passivation layer and contact the gate.

Fabrication processes of the invention enhance the breakdown characteristics of a MODFET because the gate feed is spaced from the two-dimensional gas by the passivation layer. The parasitic gate capacitance is reduced because the gate feed is spaced from a thin edge (e.g., <100 angstroms) of the two-dimensional gas. In addition, the process facilitates the use of electron-beam lithography for defining gate patterns with lengths (e.g., ~0.25 micrometer) that are compatible with high microwave cut-off frequencies.

Preferably, the e-beam lithography of the process is utilized so as to form the gate with a T-shaped cross section and the isolation step of the process is carried out by dry etching the layered semiconductor structure with ions of a reactive gas.

In an exemplary MODFET fabricated with a process of the invention, the first semiconductor layer is gallium nitride, the charge carrier is an N-type dopant in the form of silicon, the second semiconductor layer is aluminium gallium nitride, the ohmic contacts comprise titanium, aluminum, nickel and gold, the gate and gate feed are nickel and gold and the passivation layer is silicon dioxide.

The novel features of the invention are set forth with particularity in the appended claims. The invention will be best understood from the following description when read in conjunction with the accompanying drawings.

BRIEF DESCRIPTION OF THE DRAWINGS

FIG. 1 is a plan view of a MODFET after initial steps of a fabrication process of the present invention;

FIG. 2 is an enlarged and rotated view along the plane 2—2 of FIG. 1;

FIG. 3 is a view similar to FIG. 1 which illustrates the MODFET of FIGS. 1 and 2 after a subsequent isolation step;

FIG. 4A is an enlarged and rotated view along the plane 4—4 of FIG. 3 which illustrates a sidewall preparation step;

FIG. 4B is a view similar to FIG. 4A which illustrates a gate-feed deposition step;

DETAILED DESCRIPTION OF THE PREFERRED EMBODIMENTS

Figure 6B:
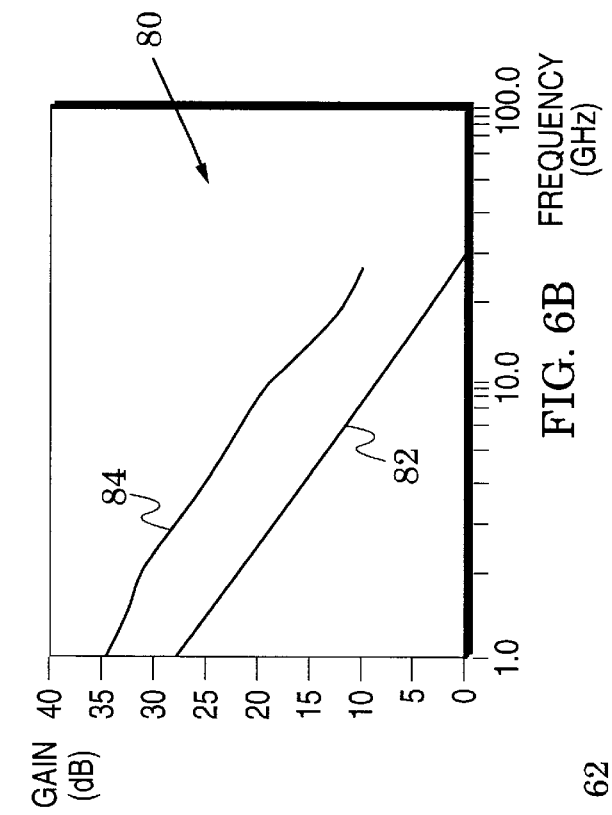
FIGS. 6A and 6B are graphs which respectively show measured breakdown and cut-off frequencies in MODFET's fabricated with processes of the present invention.

FIGS. 1–5 illustrate processes of the present invention which are particularly suited for the fabrication of MODFET's in group III nitride compound semiconductors. These processes enhance the high-power, high-temperature microwave performance of these transistors.

In initial steps of the invention, the layered semiconductor structure 20 of FIGS. 1 and 2 is formed. This structure includes a first semiconductor layer 22 which has a first band gap and is doped with a charge carrier (e.g., an N-type dopant in the form of silicon) and an undoped second semiconductor layer 24 which has a second band gap that is less than the first band gap. The second semiconductor layer 24 is positioned below the first semiconductor layer to generate a two-dimensional electron gas 26 in the semiconductor structure 20.

The band-gap difference between the first and second semiconductor layers forms a potential well in the conduction-band edge of the second semiconductor layer 24. The second semiconductor layer 24 is often referred to as a "channel" layer and the first semiconductor layer 22 is often referred to as a "donor" layer because its dopants are donated to the potential well where they form the two-dimensional electron gas 26. Because the second semiconductor layer 24 is undoped, the movement of these carriers is not inhibited by scattering from ionized impurities as would have been the case in the donor layer 22. Accordingly, carrier mobility is enhanced.

The layered semiconductor structure 20 also has a semiconductor layer 28 which separates the first and second semiconductor layers 22 and 24. This "spacer" layer 28 is undoped. Although it decreases the carrier density in the two-dimensional electron gas 26, it further enhances the carrier mobility.

A pair of source ohmic contacts 30 and 31 and a drain ohmic contact 34 are formed so that they communicate with the two-dimensional electron gas 26. In an exemplary process, the ohmic contacts 30, 31 and 34 are fabricated by evaporating a metal system of titanium, aluminum, nickel and gold onto the layered semiconductor structure 20. This metal system is then alloyed at an elevated temperature (e.g., 900° C.) so that it penetrates the layered semiconductor structure 20 (as indicated by broken lines 36) and communicates with the two-dimensional electron gas 26.

The breakdown voltage (from drain to source) of the MODFET would be degraded if the ohmic contacts 30, 31 and 34 directly contacted the highly doped first semiconductor layer 22. Accordingly, a cap layer 38 is preferably carried over the first semiconductor layer 22 and the ohmic metal system of these contacts is evaporated on this cap layer. The cap layer preferably has the lightest doping that can be fabricated. This doping level is typically referred to as an unintentional doping (UID) level because some doping will inevitably be present.

The first and second semiconductor layers 22 and 24, the spacer layer 28, the ohmic contacts 30, 31 and 34 and the cap layer 38 are carried on an insulating substrate 40. Exemplary substrates for use with group III nitride compound semiconductors are sapphire and silicon carbide.

In order to clearly illustrate structural details, FIG. 2 is not drawn proportionally. In particular, the second semiconductor layer 24 and the substrate 40 are much thicker than shown. In an exemplary layered semiconductor structure 20, the first semiconductor layer 22 is aluminum$_{0.15}$ gallium$_{0.85}$ nitride and is ~200 angstroms thick. This donor layer is doped (e.g., by incorporating silicon or selenium ions) to have an electron density in the range of $1$–$2 \times 10^{18}$ cm$^{-3}$. The second semiconductor layer 24 is undoped gallium nitride with a thickness of ~2 micrometers and the spacer layer 28 is aluminum$_{0.15}$ gallium$_{0.85}$ nitride and is ~30 angstroms thick. The cap layer is aluminum$_{0.15}$ gallium$_{0.85}$ nitride with an UID doping level. The substrate 40 is sapphire with a thickness of ~250 micrometers.

In a fabrication process of the invention, a gate is next fabricated with e-beam lithography. As shown in FIG. 2, an e-beam resist 42 is formed over the layered semiconductor structure 20. A gate pattern is written into the resist 42 with an e-beam and, subsequently, a metallic gate 44 is evaporated into the gate pattern. Because of the high resolution of e-beam lithography, the gate length 46 can be made quite small (e.g., ~0.25 micrometer) to enhance the cut-off frequencies of the fabricated MODFET. Because current flows laterally beneath the gate 44, the dimension 46 is conventionally referred to as the gate "length". As shown in FIG. 1, the gate 46 extends over the entire width of the drain 34. Preferably, the gate pattern is formed (e.g., with a two-level e-beam resist) so that the gate has a wider upper portion 48, i.e., the gate is T-shaped. The wider portion 48 of the gate reduces the gate resistance. The metallic gate preferably includes a thin layer of nickel to enhance adhesion to the cap layer 38 and a thick (e.g., ~400 nanometers) covering layer of gold to lower resistivity.

Charging of the e-beam in the e-beam writing step was prevented because the two-dimensional electron gas 26 forms a low-resistance sheet over the lateral extent of the semiconductor die. This low-resistance sheet effectively carries away electric charges. Once the gate 46 has been defined and fabricated, the two-dimensional gas 26 can be laterally isolated on a mesa 50 (indicated in FIG. 3) to enhance its microwave performance.

Because the group III nitride compound semiconductors are resistant to wet etching, this isolation is preferably carried out with dry etching. As shown in FIG. 4A, an optical resist 49 is deposited over the cap layer 38, the ohmic contacts 30, 31 and 34 and the gate 44 and patterned with optical radiation to expose portions of the cap layer 38. The exposed portions are then etched with ions of a reactive gas (e.g., chlorine) to define the mesa 50. This process is conventionally referred to as reactive ion etching (RIE).

The lateral extent of the mesa 50 is indicated in FIG. 3 by a fine line that surrounds the source ohmic contacts 30 and 31, the drain ohmic contact 34 and the gate 46. Because dry etching is an anisotropic process, it will cause very little lateral etching. That is, the dry etching produces a nearly vertical mesa sidewall 52 as shown in FIG. 4A. As also shown in FIG. 4A, the depth of the sidewall 52 is preferably deep enough to isolate the two-dimensional gas 26. Accordingly, the sidewall 52 should extend sufficiently into the second semiconductor layer 24 but need not extend completely to the substrate 40.

Once the isolation step has been completed, an environmentally-protective passivation layer is deposited over the mesa sidewall 52. As indicated in FIG. 4A, this deposition is preferably carried out so that the flux direction 56 of the passivation layer forms a flux angle (e.g., ~45 degrees) with the mesa sidewall 52. This orientation of passivation flux insures passivation coverage of the mesa sidewall and, in particular, coverage of the exposed edge of the two-dimensional electron gas 26. The deposition process is continued until a reasonably thick (e.g., ~100 nanometers) passivation layer 60 has been deposited over the mesa sidewall 52 as shown in FIG. 4B. Exemplary passivation materials are silicon dioxide and silicon nitride which are typically deposited by evaporation.

The optical resist 49 that was used in the previous isolation step is preferably also used in the deposition of the passivation layer 60. In this latter fabrication step it is preferably used in a "lift-off" process. That is, the passivation material that is evaporated over the resist 49 is lifted off when the resist 49 is removed with conventional solvents. Thus, the passivation layer 60 is self-aligned with the sidewall 52 that was formed in the prior isolation step.

After the passivation layer 60 has been deposited, a metallic gate feed 62 is preferably defined by optical photolithographic techniques and deposited to pass over the passivation layer 60 and contact the gate 46. These steps are preferably accomplished with a lift-off process. That is, the undesired metallic deposition lies over the optical resist and is removed when the optical resist is removed with conventional solvents.

Figure 5:
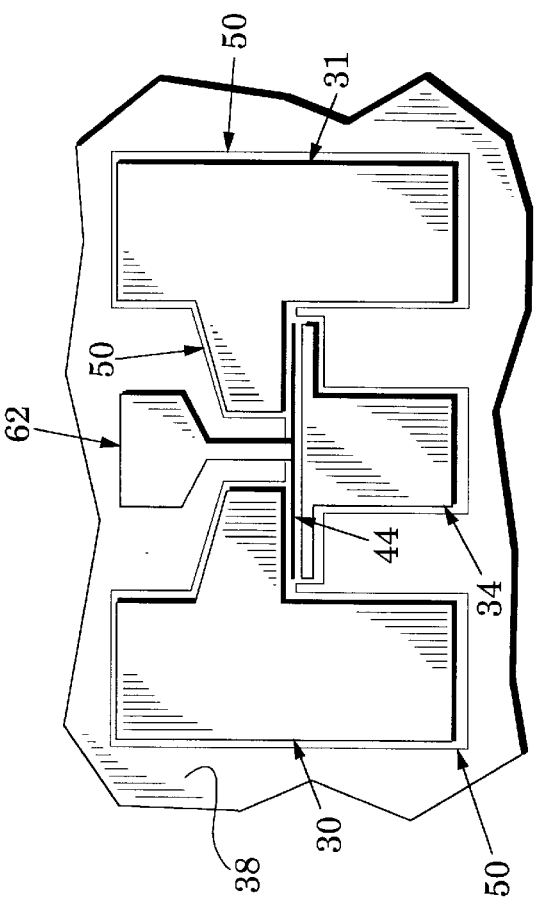
FIG. 5 is a plan view of the MODFET of FIG. 4B.

The gate feed 62 is shown in cross section in FIG. 4B and in plan view in FIG. 5. Similar to the gate 44, the metallic gate feed 62 is preferably deposited with a thin layer of nickel to enhance adhesion and a thick covering layer of gold. In the case of the gate feed 62, the thickness of the gold is preferably increased (e.g., to ~800 nanometers) to further lower resistivity. Although misregistration may cause a lip 63 to be deposited (see FIG. 4B) between the gate 44 and the cap layer 38, this is of no consequence because the gate feed 62 contacts the gate in an inactive region where the source ohmic contacts 30 and 31 are not present (see FIG. 5).

In accordance with a feature of the present invention, the gate feed 62 is spaced from the two-dimensional electron gas 26 by the relatively thick passivation layer 60 to increase transistor breakdown. In addition, the gate feed 62 passes over the thin (typically <100 angstroms) edge 64 of the two-dimensional electron gas 26. Because it is spaced from the edge of the two-dimensional electron gas 26, the parasitic capacitance between the gate feed 62 and the signal currents of the two-dimensional electron gas 26 is quite small. This enhances transistor cut-off frequency.

For example, the parasitic capacitance between the gate feed 62 and the two-dimensional electron gas 26 is greatly reduced from what it would be if the gate feed were directed outward over the cap layer 38. In this latter arrangement, the capacitance would be much higher because the gate feed would be spaced from the broad side of the two-dimensional electron gas 26.

The MODFET structure of FIGS. 4B and 5 can be placed in a microwave package with conventional attachment structures (e.g., wire bonds) coupled to the source ohmic contacts 30 and 31, the drain ohmic A gallium nitride MODFET prototype was fabricated in accordance with the teachings of the invention. In particular, e-beam lithography was used to define a T-shaped gate (44 in FIG. 4B) with a length (46 in FIG. 2) of ~0.25 micrometer and a gate width (the long dimension of the gate 44 in FIG. 5) of ~100 micrometers. The thickness of the passivation layer 60 of FIG. 4B was ~1000 angstroms of silicon dioxide.

Figure 6A:
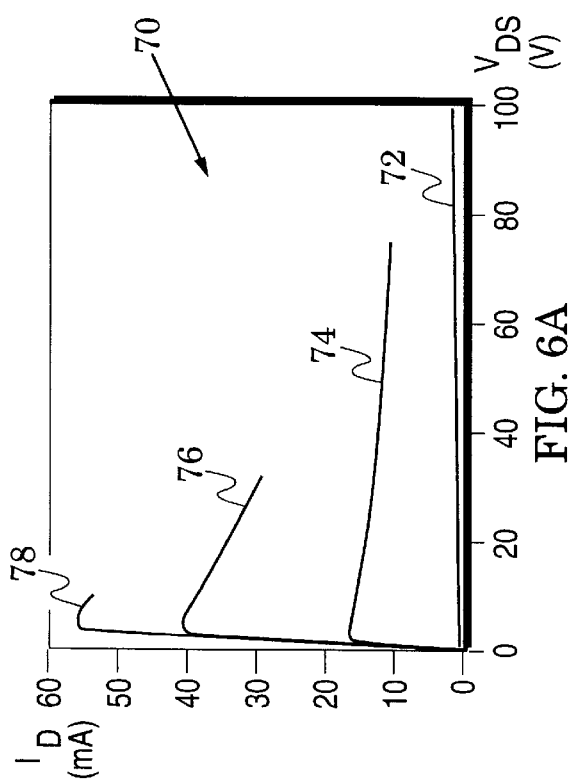

Graph 70 of FIG. 6A illustrates prototype DC drain currents as a function of drain-to-source voltage and of different gate voltages, i.e., each trace 72, 74, 76 and 78 represents a drain current for a different gate voltage. As can be seen from the graph, trace 72 indicates that drain-to-source breakdown was not reached at 100 volts (tests of other prototypes fabricated in accordance with the invention indicated drain-to-source breakdowns as high as 140 volts).

The same gallium nitride MODFET prototype was tested for current gain and power gain with a drain-to-source voltage of ~35 volts (the highest bias permitted by the test instrumentation). Measured current gain and power gain are shown respectively as curves 82 and 84 of graph 80 of FIG. 6B. These curves indicate that the measured current gain and power gain cut-off frequencies were ~30 and ~80 GHz respectively.

The prototype test results of FIGS. 6A and 6B show that fabrication processes of the invention can simultaneously achieve high breakdown and high cut-off frequencies in gallium nitride MODFET's. Although fabrication processes of the invention have been described with reference to gallium nitride compound semiconductors, the teachings of the invention are also suitable for other group III nitride compound semiconductors (e.g., aluminum nitride, indium nitride and their alloys).

The processes of the invention overcome the fabrication difficulties of these compound semiconductors. In particular, their tendency to charge e-beams because of their wide bandgaps and their resistance to chemical etchants. This resistance prevents, for example, a process of undercutting the gate feed 62 in FIG. 4B in order to space it from the edge 64 of the two-dimensional electron gas 26.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of fabricating a high-power microwave field-effect transistor in Group III nitride compound semiconductors, comprising the steps of:

providing a layered semiconductor structure which includes:

a) a first Group III nitride compound semiconductor layer having a first band gap and doped with a charge carrier;

b) a second Group III nitride compound semiconductor layer having a second band gap that is less than said first band gap and positioned below said first semiconductor layer to generate a two-dimensional electron gas in said second semiconductor layer;

c) a high-resistivity substrate which supports said first and second semiconductor layers; and d) source and drain ohmic contacts which communicate with said two-dimensional electron gas;

with electron-beam lithography processes, forming a metallic gate between said source and drain ohmic contacts;

after said forming step, dry etching said semiconductor structure to isolate said gate, said source and drain ohmic contacts, said first semiconductor layer and said two-dimensional gas on a mesa with a substantially vertical mesa sidewall;

tilting a passivation flux sufficiently from a portion of said mesa sidewall to cover an exposed edge of said two-dimensional electron gas with a passivation layer; and depositing a gate feed which passes over said passivation layer and contacts said gate;

said gate feed and said exposed edge of said two-dimensional gas thus separated by said passivation layer.

2. The method of claim 1, wherein said dry etching step includes the step of performing said dry etching with ions of a reactive gas.

3. The method of claim 2, wherein said reactive gas is chlorine.

4. The method of claim 1, wherein said passivation layer comprises silicon dioxide.

5. The method of claim 1, wherein said gate feed depositing step includes the step of evaporating nickel and gold.

6. The method of claim 1, wherein said providing step includes the steps of:

forming said second semiconductor layer of gallium nitride; and forming said first semiconductor layer of aluminium gallium nitride.

7. The method of claim 1, wherein said high-resistivity substrate comprises sapphire.

8. The method of claim 1, wherein said providing step includes the steps of:

depositing a metal system on said layered semiconductor structure; and alloying said metal system to form said ohmic contacts.

9. The method of claim 8, wherein said metal system comprises titanium, aluminum, nickel and gold.

10. The method of claim 1, wherein said forming step includes the step of causing said gate to have a T-shaped cross-sectional shape.

11. The method of claim 1, wherein said providing step further includes the steps of:

depositing a Group III nitride compound semiconductor cap layer over said first semiconductor layer; and prior to formation of said first semiconductor layer, depositing a Group III nitride compound semiconductor spacer layer over said second semiconductor layer.

* * * * *